(12) United States Patent
Lee

(10) Patent No.: US 9,472,292 B1
(45) Date of Patent: Oct. 18, 2016

(54) SEMICONDUCTOR MEMORY DEVICE

(71) Applicant: SK hynix Inc., Gyeonggi-do (KR)

(72) Inventor: Hee Youl Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/050,798

(22) Filed: Feb. 23, 2016

(30) Foreign Application Priority Data

Sep. 25, 2015 (KR) .......................... 10-2015-0136176

(51) Int. Cl.
  *G11C 11/34* (2006.01)
  *G11C 16/22* (2006.01)
  *G11C 16/08* (2006.01)
  *G11C 16/30* (2006.01)

(52) U.S. Cl.
  CPC .............. *G11C 16/22* (2013.01); *G11C 16/08* (2013.01); *G11C 16/30* (2013.01)

(58) Field of Classification Search
  CPC ........ G11C 16/12; G11C 16/08; G11C 16/30
  USPC ............ 365/185.13, 185.11, 185.18, 185.23, 365/51, 63, 230.01, 230.03, 230.06
  See application file for complete search history.

(56) References Cited

U.S. PATENT DOCUMENTS

2015/0340096 A1* 11/2015 Shim ...................... G11C 5/063
                                                      365/185.13

FOREIGN PATENT DOCUMENTS

| KR | 1020090096879 | 9/2009 |
| KR | 101083680 | 11/2011 |
| KR | 1020120053232 | 5/2012 |
| KR | 1020130031483 | 3/2013 |

* cited by examiner

*Primary Examiner* — Fernando Hidalgo
(74) *Attorney, Agent, or Firm* — IP & T Group LLP

(57) ABSTRACT

A semiconductor memory device includes a memory unit including a first memory block and a second memory block, a power supply unit suitable for applying a plurality of operating voltages to one of first global lines or second global lines, a switching circuit suitable for switching the first global lines and first internal global lines in response to a first control signal and switching the second global lines and second internal global lines in response to a second control signal, and a pass circuit suitable for electrically connecting the first internal global lines to word lines and selection lines of the first memory block and electrically connecting the second internal global lines to word lines and selection lines of the second memory block in response to a block selection signal.

20 Claims, 9 Drawing Sheets

SEMICONDUCTOR MEMORY DEVICE

CROSS-REFERENCE TO RELATED APPLICATION

The present application claims priority under 35 U.S.C. §119(a) to Korean patent application number 10-2015-0136176, filed on Sep. 25, 2015, the entire disclosure of which is incorporated herein by reference in its entirety.

BACKGROUND

1. Field of Invention

Various embodiments of the invention relate to a semiconductor memory device.

2. Description of Related Art

Semiconductor memory devices may be classified into volatile memory devices and non-volatile memory devices.

Volatile memory devices such as Static Random Access memory (SRAM), Dynamic RAM (DRAM) and Synchronous DRAM (SDRAM) do not retain data stored therein when power supply to the device is turned off. Non-volatile memory devices operate at relatively lower write and read speeds than volatile memory devices, but they retain the stored data regardless of power on/off conditions. Therefore, non-volatile memory devices are used to store data which need to be maintained even in the absence of power supply. Examples of non-volatile memory include read only memory (ROM), mask ROM (MROM), programmable ROM (PROM), erasable programmable ROM (EPROM), electrically erasable and programmable ROM (EEPROM), flash memory, Phase-change random access memory (PRAM), magnetic RAM (MRAM), resistive RAM (RRAM) and ferroelectric RAM (FRAM). Flash memories are used widely and may be classified into NOR- or NAND-type memories.

Generally, flash memories enjoy the advantages of both RAM and ROM devices. For example, flash memories may be freely programmed and erased similar to a RAM. Also, similar to a ROM, flash memories may retain the stored data even when they are not powered. Flash memories have been widely used as the storage media of portable electronic devices such as mobile phones, digital cameras, personal digital assistants (PDAs), and MP3 players.

SUMMARY

Various embodiments are directed to a semiconductor memory device capable of improving a threshold voltage distribution of memory cells by preventing electrons from being trapped in a channel of an unselected memory block during a program operation of the semiconductor memory device.

According to an embodiment, a semiconductor memory device may include a memory unit including a first memory block and a second memory block, a power supply unit suitable for applying a plurality of operating voltages to one of first global lines or second global lines, a switching circuit suitable for switching the first global lines and first internal global lines in response to a first control signal and switching the second global lines and second internal global lines in response to a second control signal, and a pass circuit suitable for electrically connecting the first internal global lines to word lines and selection lines of the first memory block and electrically connecting the second internal global lines to word lines and selection lines of the second memory block in response to a block selection signal, wherein the switching circuit is suitable for controlling one of the first internal global lines or the second internal global lines corresponding to an unselected memory block among the first and second memory blocks to be in a floating state.

According to another embodiment, a semiconductor memory device may include a memory unit including a first memory block and a second memory block, a power supply unit suitable for applying a plurality of operating voltages to one of first global lines or second global lines, a switching circuit suitable for switching the first global lines and first internal global lines in response to a first control signal, and switching the second global lines and second internal global lines in response to a second control signal, and a pass circuit suitable for electrically connecting the first internal global lines to word lines and selection lines of the first memory block, and electrically connecting the second internal global lines to word lines and selection lines of the second memory block in response to a block selection signal, wherein the power supply unit is suitable for applying the plurality of operating voltages to one of the first global lines or the second global lines corresponding to a selected memory block among the first memory block and the second memory block, and applying a predetermined voltage lower than the operating voltages to one of the first global lines or the second global lines corresponding to an unselected memory block among the first memory block and the second memory block.

According to another embodiment, a semiconductor memory device may include a memory unit including a first memory block and a second memory block, a power supply unit suitable for applying a plurality of operating voltages to one of first global lines or second global lines, a pass circuit suitable for electrically connecting the first global lines to word lines and selection lines of the first memory block and electrically connecting the second global lines to word lines and selection lines of the second memory block in response to a block selection signal, and a selection line control circuit suitable for controlling potential levels of selection lines of an unselected memory block among the first and second memory blocks.

DETAILED DESCRIPTION

Figure 1:
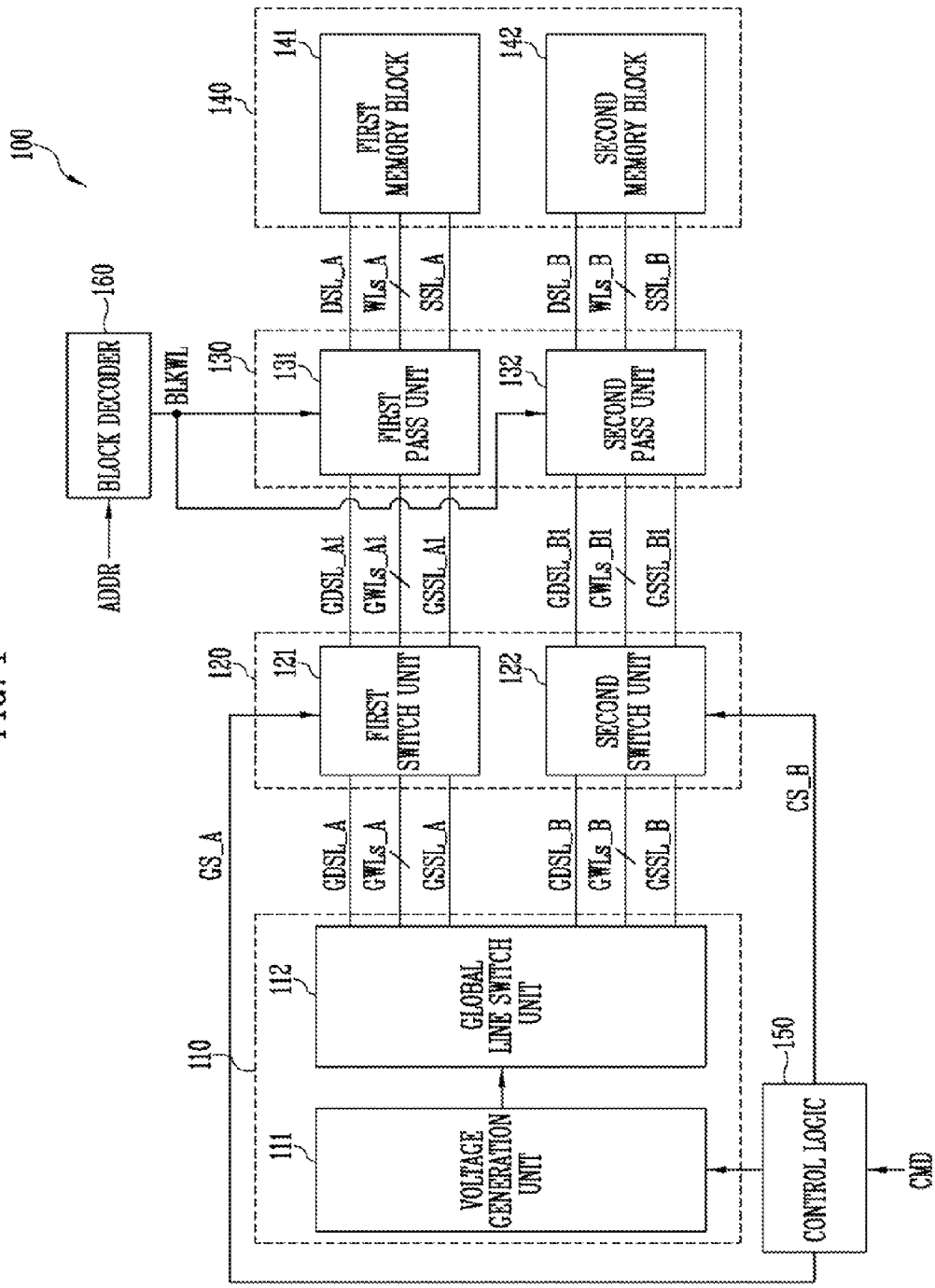
FIG. 1 is a block diagram illustrating a semiconductor memory device, according to an embodiment of the invention.

Hereinafter, various exemplary embodiments of the invention will be described in detail with reference to the accompanying drawings. In the drawings, thicknesses and lengths of components may be exaggerated for convenience of illustration. In the following description, a detailed explanation of related functions and constitutions may be omitted for simplicity and conciseness. Like reference numerals refer to like elements throughout the specification and drawings.

It is also noted that in this specification, "connected/coupled" refers to one component not only directly coupling another component but also indirectly coupling another component through an intermediate component.

Referring now to FIG. 1, a semiconductor memory device 100 is provided, according to an embodiment of the invention. The semiconductor memory device 100 may include a power supply unit 110, a switch circuit 120, a pass circuit 130, a memory unit 140, a control logic 150 and a block decoder 160.

The power supply unit 110 may include a voltage generation unit 111 and a global line switch unit 112.

During a program operation, the voltage generation unit 111 may generate a plurality of operating voltages under the control of the control logic 150. For example, the operating voltages may be a program voltage, a pass voltage, and a selection transistor control voltage.

The global line switch unit 112 may switch the plurality of operating voltages generated by the voltage generation unit 111 and transfer the operating voltages to first global lines GDSL_A, GWLs_A, and GSSL_A or second global lines GDSL_B, GWLs_B, and GSSL_B. The global line switch unit 112 may receive a plurality of operating voltages generated by the voltage generation unit 111 and may transfer the operating voltages to first global lines GDSL_A, GWLs_A, and GSSL_A or second global lines GDSL_B, GWLs_B, and GSSL_B. For example, when a first memory block 141 is selected from among first and second memory blocks 141 and 142 of the memory unit 140, the global line switch unit 112 may apply the plurality of operating voltages to the first global lines GDSL_A, GWLs_A, and GSSL_A corresponding to the first memory block 141 and a voltage of 0V to the second global lines GDSL_B, GWLs_B, and GSSL_B.

The switch circuit 120 may include a first switch unit 121 and a second switch unit 122.

The first switch unit 121 may be coupled between the first global lines GDSL_A, GWLs_A, and GSSL_A and first internal global lines GDSL_A1, GWLs_A1, and GSSL_A1. The first switch unit 121 may apply the plurality of operating voltages received through the first global lines GDSL_A, GWLs_A, and GSSL_A, to the first internal global lines GDSL_A1, GWLs_A1, and GSSL_A1, or float the first internal global lines GDSL_A1, GWLs_A1, and GSSL_A1 in response to a first control signal CS_A output from the control logic 150.

The second switch unit 122 may be coupled between the second global lines GDSL_B, GWLs_B, and GSSL_B and second internal global lines GDSL_B1, GWLs_B1, and GSSL_B1. The second switch unit 122 may apply the plurality of operating voltages, input through the second global lines GDSL_B, GWLs_B, and GSSL_B, to the second internal global lines GDSL_B1, GWLs_B1, and GSSL_B1, or float the second internal global lines GDSL_B1, GWLs_B1, and GSSL_B1 In response to a second control signal CS_B output from the control logic 150.

For example, when the first memory block 141 is selected from among the first memory block 141 and the second memory block 142 during a program operation, the first switch unit 121 may apply the plurality of operating voltages received through the first global lines GDSL_A, GWLs_A, and GSSL_A to the first internal global lines GDSL_A1, GWLs_A1, and GSSL_A1 in response to the first control signal CS_A output from the control logic 150, and the second switch unit 122 may float the second internal global lines GDSL_B1, GWLs_B1, and GSSL_B1 in response to the second control signal CS_B. In other words, the switch circuit 120 may float the Internal global lines corresponding to the unselected memory block.

The first switch unit 121 may include high-voltage transistors which are turned on or off in response to the first control signal CS_A. In addition, the first control signal CS_A may be applied at a high voltage having a greater potential level than the plurality of operating voltages input through the first global lines GDSL_A, GWLs_A, and GSSL_A, or at 0 (zero) V.

The second switch unit 122 may include high-voltage transistors which are turned on or off in response to the second control signal CS_B. In addition, the second control signal CS_B may be applied at a high voltage having a higher potential level than the plurality of operating voltages input through the second global lines GDSL_B, GWLs_B, and GSSL_B, or at 0V.

The pass circuit 130 may include a first pass unit 131 and a second pass unit 132. The first pass unit 131 may electrically connect the first internal global lines GDSL_A1, GWLs_A1, and GSSL_A1 to a plurality of word lines WLs_A and selection lines DSL_A and SSL_A of the first memory block 141 in response to a block selection signal BLKWL output from the block decoder 160.

The second pass unit 132 may electrically connect the second internal global lines GDSL_B1, GWLs_B1, and GSSL_B1 to a plurality of word lines WLs_B and selection lines DSL_B and SSL_B of the second memory block 142 in response to the block selection signal BLKWL output from the block decoder 160.

The first and second pass units 131 and 132 may share one block decoder 160. Therefore, electrically connect the first internal global lines GDSL_A1, GWLs_A1, and GSSL_A1 to the plurality of word lines WLs_A and selection lines DSL_A and SSL_A of the first memory block 141 in response to the block selection signal BLKWL. The first and second pass units 131 and 132 may also electrically connect the second internal global lines GDSL_B1, GWLs_B1, and GSSL_B1 to the plurality of word lines WLs_B and selection lines DSL_B and SSL_B of the second memory block 142 in response to the same block selection signal BLKWL.

The first and second pass units 131 and 132 may include a plurality of high voltage transistors which are turned on or off in response to the block selection signal BLKWL.

The memory unit 140 may include the first memory block 141 and the second memory block 142. Each of the first memory block 141 and the second memory block 142 may include a plurality of memory cells. According to an embodiment, the plurality of memory cells may be non-volatile memory cells. Memory cells coupled to the same word line, among the plurality of memory cells, may be defined as a single page. In addition, each of the first memory block 141 and the second memory block 142 may include a plurality of strings.

The first memory block 141 and the second memory block 142 may be configured to share a common source line and bit lines.

The control logic 150 may control the power supply unit 110 and the switch circuit 120 in response to a command signal CMD which may be received from an external device (not shown). For example, when a program command associated with a program operation is received, the control logic 150 may control the voltage generation unit 111 of the power supply unit 110 to generate a plurality of operating voltages, and control the switch circuit 120. For example, the control logic 150 may output the first and the second control signals CS_A and CS_B to control the first switch and the second switch units 121 and 122, respectively, according to the selected memory block and the unselected memory block of the memory unit 140.

The block decoder 160 may generate the block selection signal BLKWL having a high voltage level when the memory block corresponding to a block address ADDR is the first memory block 141 or the second memory block 142.

Figure 2:
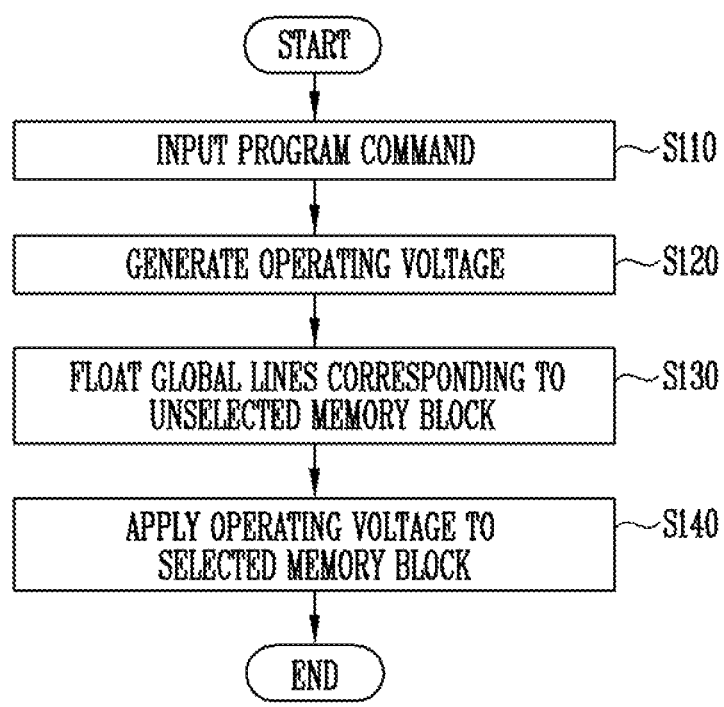
FIG. 2 is a flowchart illustrating an operation of a semiconductor memory device, according to an embodiment of the invention.

Referring now to FIG. 2 a flowchart of an operation of a semiconductor memory device is provided, according to an embodiment of the invention. For example, the operation of FIG. 2 may be a program operation of the semiconductor memory device 100 shown in FIG. 1 and is described below with reference to both FIGS. 1 and 2.

More specifically, as an example, a program operation performed by selecting the first memory block 141 from among the first and second memory blocks 141 and 142 is described below.

Accordingly, at step S110, when a program command signal CMD associated with a program operation is received from an external device, the control logic 150 may generate control signals to control the power supply unit 110 and the switch circuit 120.

At step S120, The voltage generation unit 111 of the power supply unit 110 may generate one or more operating voltages to perform a program operation in response to control of the control logic 150. For example, the voltage generation unit 111 may generate the plurality of operating voltages, such as a program voltage, a pass voltage, and a selection transistor control voltage.

The global line switch unit 112 may switch and apply the plurality of operating voltages generated by the voltage generation unit 111 to the first global lines GDSL_A, GWLs_A, and GSSL_A. In addition, the global line switch unit 112 may apply a voltage of 0V to the second global lines GDSL_B, GWLs_B, and GSSL_B.

At step S130, may float global lines corresponding to the unselected memory block. For example, the switch circuit 120 may float the second internal global lines GDSL_B2, GWLs_B2, and GSSL_B2 corresponding to the unselected second memory block 142 in response to the first control signal CS_A and the second control signal CS_B output from the control logic 150. Also, for example, the first switch unit 121 may apply the plurality of operating voltages input through the first global lines GDSL_A, GWLs_A, and GSSL_A in response to the first control signal CS_A having a high voltage, output from the control logic 150, to the first internal global lines GDSL_A1, GWLs_A1, and GSSL_A1. The second switch unit 122 may be turned off in response to the second control signal CS_B having a voltage of 0V and float the second internal global lines GDSL_B1, GWLs_B1, and GSSL_B1.

At step S140, an operating voltage may be applied to the selected memory block. For example, during the program operation, a positive voltage may be applied to the common source line shared by the first memory block 141 and the second memory block 142, whereas a positive voltage or 0V may be applied to the bit lines shared by the first memory block 141 and the second memory block 142 in response to program data.

When the first memory block 141 is a selected memory block and the second memory block 142 is an unselected memory block, the block decoder 160 may generate and output the block selection signal BLKWL having a high voltage level in response to the block address ADDR.

The first pass unit 131 may electrically connect the first internal global lines GDSL_A1, GWLs_A1, and GSSL_A1 to the plurality of word lines WLs_A and selection lines DSL_A and SSL_A of the first memory block 141 in response to the block selection signal BLKWL. The second pass unit 132 may electrically connect the second internal global lines GDSL_B1, GWLs_B1, and GSSL_B1 to the plurality of word lines WLs_B and selection lines DSL_B and SSL_B of the second memory block 142 in response to the block selection signal BLKWL.

The program and the pass voltage may be applied to the plurality of word lines WLs_A of the selected first memory block 141. The selection transistor control voltage may be applied to the selection lines DSL_A and SSL_A of the selected first memory block 141. All the word lines WLs_B and the selection lines DSL_B and SSL_B of the unselected second memory block 142 may be in a floating state.

Potential levels of the plurality of word lines WLs_B and selection lines DSL_B and SSL_B in the floating state may be increased by capacitive coupling between neighboring lines and terminals. When the potential level of each of the plurality of word lines WLs_B and selection lines DSL_B and SSL_B in the floating state is increased to 0V or greater due to capacitive coupling, generation of hot holes by a gate induced drain leakage (GIDL) phenomenon may be prevented in a lower channel of a source selection transistor. Therefore, the hot holes may be prevented from being introduced and trapped in a channel of the unselected memory block.

Subsequently, the program voltage and the pass voltage applied to the plurality of word lines WLs_A of the selected first memory block 141 may be discharged. When the potential levels of the plurality of word lines WLs_A are discharged, word lines WL<0:n> may be discharged to a predetermined voltage (e.g., approximately 2V) greater than a ground voltage. Therefore, after the program operation is completed, the plurality of word lines WLs_A may maintain a predetermined voltage level. In addition, since the channel of the first memory block 141 may maintain a weak boosting level corresponding to a predetermined potential level, change characteristics of the threshold voltage distribution of the memory cells may be improved.

Table 1 below shows potential states of word lines and selection lines of a selected memory block and an unselected memory block, among a plurality of memory blocks corresponding to pass units sharing a single block selection signal.

TABLE 1

| | Selected memory block | | | Unselected memory block | | |
|---|---|---|---|---|---|---|
| | Internal global line | Block selection signal | Word lines and selection line | Internal global lines | Block selection signal | Word lines And Selection line |
| GSSL/ SSL | 0v | High voltage | 0v | Floating | High voltage | Floating |
| GDSL/ DSL | Drain election transistor Turn on voltage | | Drain selection transistor Turn on voltage | Floating | | Floating |
| GWLs/ WLs | Program voltage or pass voltage | | Program voltage or pass voltage | Floating | | Floating |

As shown in Table 1, all the word lines and the selection lines of the unselected memory block, among the plurality of memory blocks corresponding to the pass units sharing the single block selection signal, may be in a floating state. Therefore, during a program operation of the selected memory block, generation of hot holes may be prevented in a lower channel of a source selection transistor of the unselected memory block.

According to an embodiment of the invention, the 10 second switch unit 122 corresponding to the unselected second memory block 142 may be turned off to float the second internal global lines GDSL_B1, GWLs_B1, and GSSL_B1 in response to the second control signal CS_B having a voltage of 0V.

According to another embodiment, the global line switch unit 112 may switch the plurality of operating voltages generated by the voltage generation unit 111, apply the switched operating voltages to the first global lines GDSL_A, GWLs_A, and GSSL_A corresponding to the selected first memory block 141, apply a positive voltage V1 to the second global lines GWLs_B corresponding to the unselected second memory block 142, and apply a voltage of 0V to the second global lines GDSL_B and GSSL_B corresponding to the unselected second memory block. The positive voltage V1 may be lower than the plurality of operating voltages. For example, the positive voltage V1 may be 4V or less. Subsequently, the switch circuit 120 may apply the plurality of operating voltages to the first internal global lines GDSL_A1, GWLs_A1, and GSSL_A1 corresponding to the selected first memory block 141 in response to the first control signal CS_A output from the control logic 150. Also, the switch circuit 120 may apply the positive voltage V1 to the second internal global lines GWLs corresponding to the unselected second memory block 142 and a voltage of 0V to the second internal global lines GDSL_B1, and GSSL_B1 corresponding to the unselected second memory block 142 in response to the second control signal CS_B. The second control signal CS_B may have a potential level V2, which may be higher than V1. The second control signal CS_B may be applied at the potential level V2 and then transitioned to 0V.

As a result, the positive voltage V1 may be applied to the word lines WLs of the unselected second memory block 142, and the voltage of 0V may be applied to the selection lines DSL_B and SSL_B of the unselected second memory block 142.

Alternatively, a semiconductor memory device may be configured without the switch circuit 120. For example, the global line switch unit 112 and the pass circuit 130 may be coupled through the first global lines GDSL_A, GWLs_A, and GSSL_A and the second global lines GDSL_B, GWLs_B, and GSSL_B. The plurality of operating voltages and the positive voltage V1 output from the global line switch unit 112 may be applied to the pass circuit 130 and then applied to the selected memory block and the unselected memory block.

Table 2 below shows potential states of word lines and selection lines of an unselected memory block and a selected memory block when a positive voltage is applied to the word lines of the unselected memory block as described above.

TABLE 2

| | Selected memory block | | | Unselected memory block | | |
|---|---|---|---|---|---|---|
| | Internal global line | Block selection signal | Word lines and selection line | Internal global lines | Block selection signal | Word lines and selection line |
| GSSL/ SSL | 0V | High voltage | 0V | 0V | High voltage | 0V |
| GDSL/ DSL | Drain selection transistor Turn-on voltage | | Drain selection transistor Turn-on voltage | 0V | | 0V |
| GWLs/ WLs | Program voltage or pass voltage | | Program voltage or pass voltage | V1 | | V1 |

As shown in Table 2, the positive voltage V1 may be applied to the word lines of the unselected memory block, among the plurality of memory blocks corresponding to the pass units sharing a single block selection signal. Also, a voltage of 0V may be applied to the selection lines of the unselected memory block, so that the drain selection transistor and the source selection transistor may be turned off. Since the drain selection transistor and the source selection transistor may be turned off, leakage current may be prevented, and generation of hot holes may be prevented in a lower channel of the source selection transistor by the word lines to which the positive voltage V1 is applied.

Figure 3:
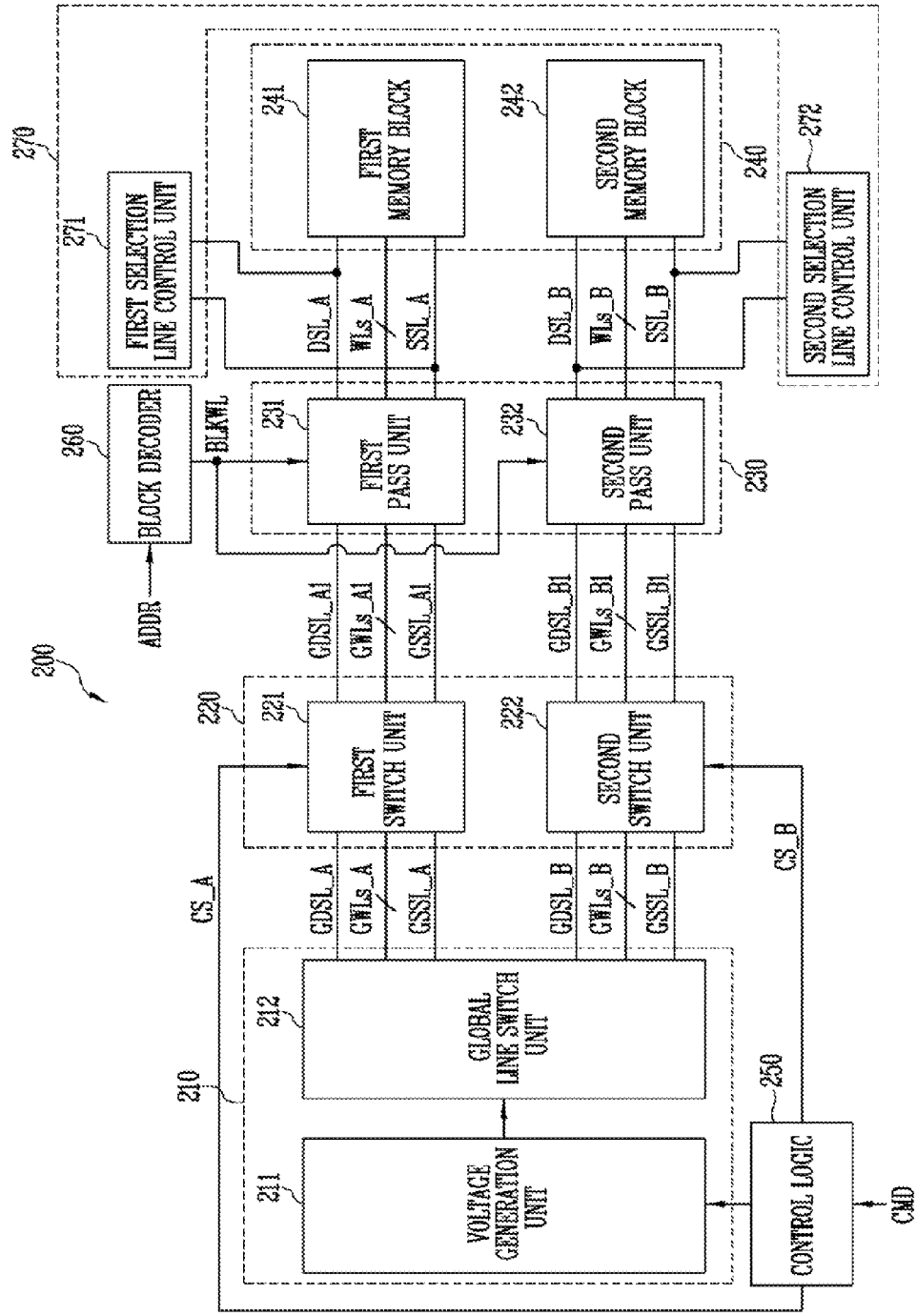
FIG. 3 is a block diagram illustrating a semiconductor memory, device according to another embodiment of the invention.

FIG. 3 is a block diagram illustrating a semiconductor memory device 200, according to another embodiment of the invention.

Referring to FIG. 3, the semiconductor memory device 200 may include a power supply unit 210, a switch circuit 220, a pass circuit 230, a memory unit 240, a control logic 250, a block decoder 260 and a selection line control circuit 270.

The power supply unit 210 may include a voltage generation unit 211 and a global line switch unit 212.

The voltage generation unit 211 may generate a plurality of operating voltages in response to the control of the control logic 250 during a program operation. For example, the operating voltages may include a program voltage, a pass voltage, and a selection transistor control voltage.

The global line switch unit 212 may switch and apply the plurality of operating voltages generated by the voltage generation unit 211 to the first global lines GDSL_A, GWLs_A, and GSSL_A or the second global lines GDSL_B, GWLs_B, and GSSL_B.

The power supply unit 210 may have the same configuration as the power supply unit 110 shown in FIG. 1 and perform the same operations as the power supply unit 110.

The switch circuit 220 may include a first switch unit 221 and a second switch unit 222.

The first switch unit 221 may be coupled between the first global lines GDSL_A, GWLs_A, and GSSL_A and the first internal global lines GDSL_A1, GWLs_A1, and GSSL_A1. The first switch unit 221 may apply the plurality of operating voltages, received through the first global lines GDSL_A, GWLs_A, and GSSL_A, to the first internal global lines GDSL_A1, GWLs_A1, and GSSL_A1, or float the first internal global lines GDSL_A1, GWLs_A1, and GSSL_A1 in response to the first control signal CS_A output from the control logic 250.

The second switch unit 222 may be coupled between the second global lines GDSL_B, GWLs_B, and GSSL_B and the second internal global lines GDSL_B1, GWLs_B1, and GSSL_B1. The second switch unit 222 may apply the plurality of operating voltages received through the second global lines GDSL_B, GWLs_B, and GSSL_B, to the second internal global lines GDSL_B1, GWLs_B1, and GSSL_B1, or float the second internal global lines GDSL_B1, GWLs_B1, and GSSL_B1 in response to the second control signal CS_B output from the control logic 250.

The switch circuit 220 may have substantially the same configuration as the switch circuit 120 shown in FIG. 1 and perform the same operations as the switch circuit 120.

The pass circuit 230 may include a first pass unit 231 and a second pass unit 232.

The first pass unit 231 may electrically connect the first internal global lines GDSL_A1, GWLs_A1, and GSSL_A1 to the plurality of word lines WLs_A and selection lines DSL_A and SSL_A of the first memory block 241 in response to the block selection signal BLKWL output from the block decoder 260.

The second pass unit 232 may electrically connect the second internal global lines GDSL_B1, GWLs_B1, and GSSL_B1 to the plurality of word lines WLs_B and selection lines DSL_B and SSL_B of the second memory block 242 in response to the block selection signal BLKWL output from the block decoder 260.

The pass circuit 230 may have substantially the same configuration as the pass circuit 130 shown in FIG. 1 and perform the same operation as the pass circuit 130.

The memory unit 240 may include the first memory block 241 and the second memory block 242. The memory 240 may have the same configuration as the memory 140 shown in FIG. 1 and perform the same operation as the memory 140.

The control logic 250 may control the power supply unit 210 and the switch circuit 220 in response to the command signal CMD which is input from an external device (not shown). The control logic 250 may have substantially the same configuration as the control logic 150 as shown in FIG. 1 and perform the same operation as the control logic 150.

The block decoder 260 may generate and output the block selection signal BLKWL having a high voltage level when a memory block corresponding to the block address ADDR is the first memory block 241 or the second memory block 242.

The selection line control circuit 270 may include a first and a second selection line control units 271 and 272.

The first selection line control unit 271 may correspond to the first memory block 241 and control potential levels of the drain selection line DSL_A and the source selection line SSL_A of the first memory block 241. For example, during a program operation, when the first memory block 241 is unselected, the first selection line control unit 271 may control the potential levels of the drain selection line DSL_A and the source selection line SSL_A of the first memory block 241 to be 0V.

The second selection line control unit 272 may correspond to the second memory block 242 and control potential levels of a drain selection line DSL_B and a source selection line SSL_B of the second memory block 242. For example, during a program operation, when the second memory block 242 is unselected, the second selection line control unit 272 may control the potential levels of the drain selection line DSL_B and the source selection line SSL_B of the second memory block 242 to be 0V.

The selection line control circuit 270 may be controlled by the control logic 250.

Figure 4:
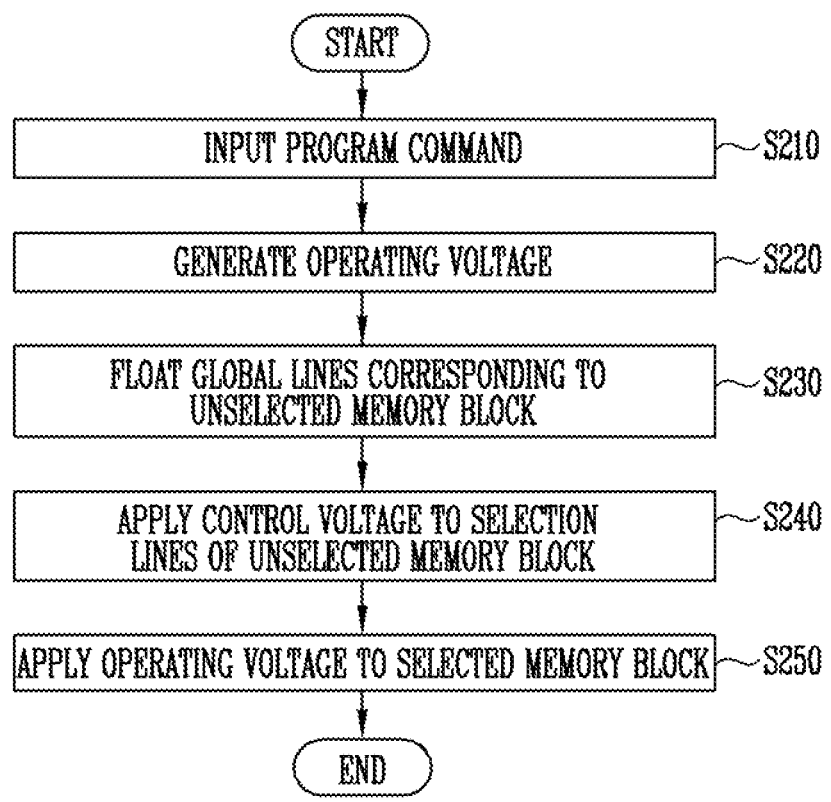
FIG. 4 is a flowchart illustrating an operation of a semiconductor memory device, according to another embodiment of the invention.

FIG. 4 is a flowchart illustrating an operation of a semiconductor memory device according to another embodiment of the invention. For example, an operation of FIG. 4 may be an operation of the semiconductor memory device 200 shown in FIG. 3.

Operations of a semiconductor memory device according to another embodiment are described below with reference to FIGS. 3 and 4.

According to an embodiment, an example in which a program operation is performed by selecting the first memory block 241 from among the first and second memory blocks 241 and 242 is described.

At step S210, when an input program command signal CMD associated with a program operation is received from an external source, the control logic 250 may generate control signals to control the power supply unit 210 and the switch circuit 220.

At step S220 the voltage generation unit may generate an operating voltage. For example, the voltage generation unit 211 may generate a plurality of operating voltages for the program operation in response to control of the control logic 250. For example, the voltage generation unit 211 may generate a program voltage, a pass voltage and/or a selection transistor control voltage.

The global line switch unit 212 may activate and apply the plurality of operating voltages generated by the voltage generation unit 211 to the first global lines GDSL_A, GWLs_A, and GSSL_A. In addition, the global line switch unit 112 may apply a voltage of 0V to the second global lines GDSL_B, GWLs_B, and GSSL_B.

At step S230, the switch circuit 220 may float global lines corresponding to an unselected memory block (S230). For example, the switch circuit 220 may float the second internal global lines GDSL_B2, GWLs_B2, and GSSL_B2 corresponding to the unselected second memory block 242 in response to the first and the second control signals CS_A and CS_B output from the control logic 250. For example, the first switch unit 221 may apply the plurality of operating voltages received through the first global lines GDSL_A, GWLs_A, and GSSL_A, to the first internal global lines GDSL_A1, GWLs_A1, and GSSL_A1, in response to the first control signal CS_A having a high voltage from the control logic 250. The second switch unit 222 may be turned off to float the second internal global lines GDSL_B1, GWLs_B1, and GSSL_B1 in response to the second control signal CS_B having a voltage of 0V.

At step S240 a control voltage may be applied to selection lines of unselected memory block (S240)

The second selection line control unit 272 corresponding to the unselected second memory block 242 among the first selection line control unit 271 and the second selection line control unit 272 of the selection line control circuit 270 may apply a voltage of 0V to the drain selection line DSL_B and the source selection line SSL_B of the second memory block 242. The second selection line control unit 272 may selectively apply the voltage of 0V to one of the drain selection line DSL_B and the source selection line SSL_B.

At step 25P, an operating voltage may be applied to the selected memory block. For example, during the program operation, a positive voltage may be applied to the common source line shared by the first memory block 241 and the second memory block 142, and a positive voltage or a voltage of 0V may be applied to bit lines shared by the first memory block 241 and the second memory block 242 according to program data.

When the first memory block 241 is a selected memory block and the second memory block 242 is an unselected memory block, the block decoder 260 may generate and output the block selection signal BLKWL having a high voltage level in response to the block address ADDR.

The first pass unit 231 may electrically connect first internal global lines GDSL_A1, GWLs_A1, and GSSL_A1 to the plurality of word lines WLs_A and selection lines DSL_A and SSL_A of the first memory block 241 in response to the block selection signal BLKWL. The second pass unit 232 may electrically connect the second internal global lines GDSL_B1, GWLs_B1, and GSSL_B1 to the word lines WLs_B and the selection lines DSL_B and SSL_B of the second memory block 242 in response to the block selection signal BLKWL.

The program voltage and the pass voltage may be applied to the plurality of word lines WLs_A of the selected first memory block 241, and the selection transistor control voltage may be applied to the selection lines DSL_A and SSL_A of the selected first memory block 241. The plurality of word lines WLs_B of the unselected second memory block 242 may be in a floating state.

Potential levels of the plurality of word lines WLs_B in the floating state may be increased by capacitive coupling with neighboring wires and terminals. When the potential level of each of the plurality of word lines WLs_B is increased to 0V or more by capacitive coupling, generation of hot holes may be prevented in a lower channel of a source selection transistor by a gate induced drain leakage (GIDL) phenomenon. Therefore, hot holes may be prevented from being introduced and trapped in the channel of the unselected memory block. In addition, a voltage of 0V may be applied to the drain selection line DSL_B and the source selection line SSL_B by the selection line control circuit 270 to turn off drain selection transistors and source selection transistors of the second memory block 242. Therefore, leakage current flowing through strings in the second memory block 242 may be blocked.

Subsequently, the program voltage and the pass voltage being applied to the plurality of word lines WLs_A of the selected first memory block 141 may be discharged. When the potential levels of the plurality of word lines WLs_A are discharged, the word lines WL<0:n> may be discharged to be a predetermined voltage (e.g., approximately 2V) which is greater than a ground voltage. As a result, after a program operation is completed, the plurality of word lines WLs_A may maintain a predetermined voltage level. A channel of the first memory block 141 may maintain a weak boosting level corresponding to a predetermined potential level, so that change characteristics of a threshold voltage distribution of the memory cells may be improved.

Table 3 below shows potential states of word lines and selection lines of a selected memory block and an unselected memory block according to the above-described embodiment.

TABLE 3

| | Selected memory block | | | Unselected memory block | | |
|---|---|---|---|---|---|---|
| | Internal global line | Block selection signal | Word lines and selection line | Internal global lines | Block selection signal | Word lines and selection line |
| sGSSL/ SSL | 0V | High voltage | 0V | Floating | High voltage | 0V |
| GDSL/ DSL | Drain selection transistor turn-on voltage | | Drain selection transistor Turn-on voltage | Floating | | 0V |
| GWLs/ WLs | Program voltage or pass voltage | | Program voltage or pass voltage | Floating | | Floating |

As shown in Table 3, the word lines of an unselected memory block, among the plurality of memory blocks corresponding to the pass units sharing a single block selection signal, may be in a floating state, and a voltage of 0V may be applied to the selected lines. Therefore, during a program operation of the selected memory block, generation of hot holes may be prevented in a lower channel of a source selection transistor of the unselected memory block, and selection transistors may be turned off to block leakage current.

Figure 5:
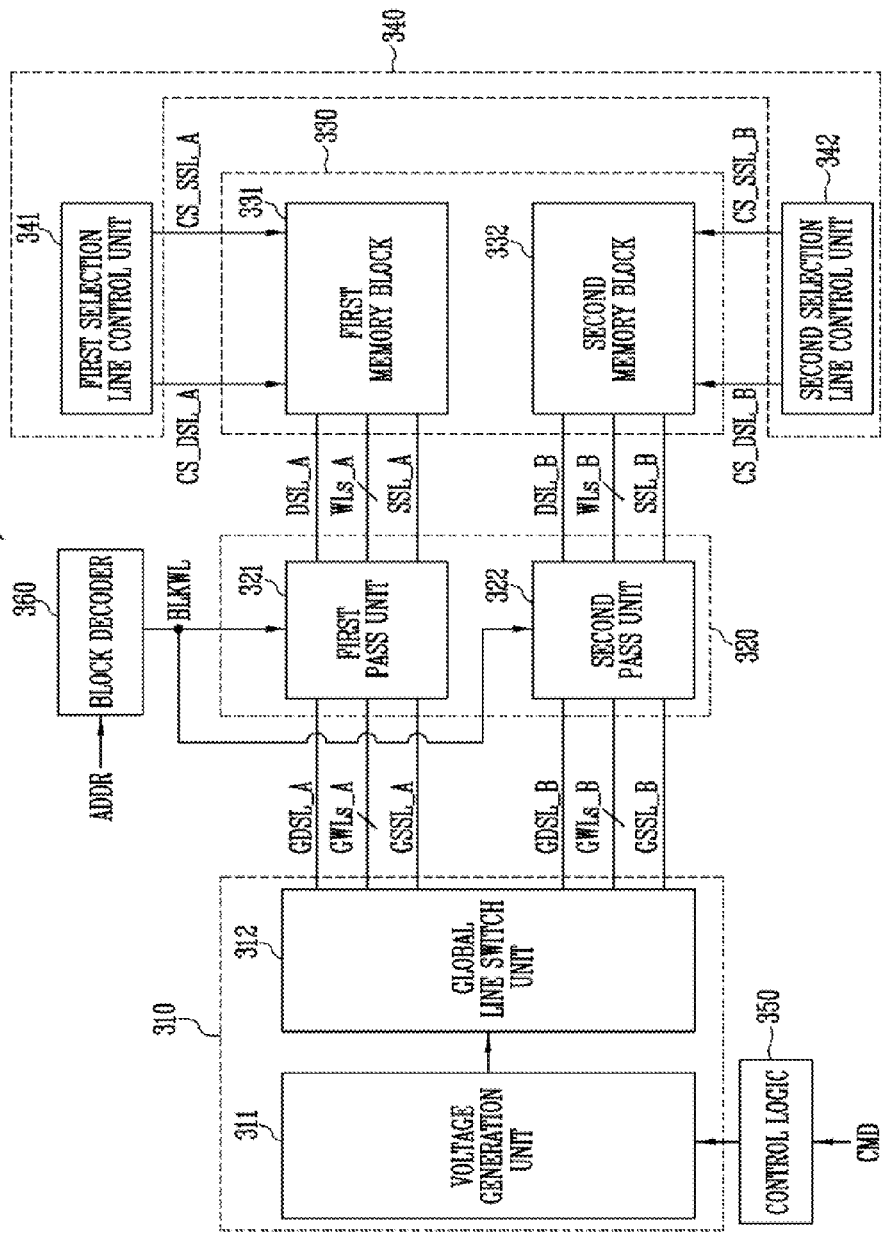
FIG. 5 is a block diagram illustrating a semiconductor memory device, according to yet another embodiment of the invention.

Referring to FIG. 5 a semiconductor memory device 300 according to yet another embodiment of the invention is provided. The semiconductor memory device 300 may include a power supply unit 310, a pass circuit 320, a memory unit 330, a selection line control circuit 340, a control logic 350 and a block decoder 360. The power supply unit 310 may include a voltage generation unit 311 and a global line switch unit 312.

The voltage generation unit 311 may generate a plurality of operating voltages in response to the control of the control logic 350 during a program operation. For example, the plurality of operating voltages may include a program voltage, a pass voltage and a selection transistor control voltage.

The global line switch unit 312 may switch the plurality of operating voltages generated by the voltage generation unit 311 and apply the switched operating voltages to the first global lines GDSL_A, GWLs_A, and GSSL_A or the second global lines GDSL_B, GWLs_B, and GSSL_B.

The power supply unit 310 may have substantially the same configuration and perform the same operations as the power supply unit 110 shown in FIG. 1. The pass circuit 320 may include a first pass unit 321 and a second pass unit 322.

The first pass unit 321 may electrically connect the first global lines GDSL_A, GWLs_A, and GSSL_A and the plurality of word lines WLs_A and selection lines DSL_A and SSL_A of the first memory block 331 in response to the block selection signal BLKWL output from the block decoder 360.

The second pass unit 322 may electrically connect the second global lines GDSL_B, GWLs_B, and GSSL_B to a plurality of word lines WLs_B and selection lines DSL_B and SSL_B of the second memory block 332 in response to the block selection signal BLKWL output from the block decoder 360.

The pass circuit 320 may have substantially the same configuration and perform the same operations as the pass circuit 130 shown in FIG. 1. The memory unit 330 may include the first memory block 331 and the second memory block 332. Each of the first and second memory blocks 331, 332 may include a voltage controller or control unit connected to a drain selection line and a source selection line. A detailed configuration of each of the first and second memory blocks 331, 332 is described below with reference to FIG. 6.

The selection line control circuit 340 may include a first and a second selection line control units 341 and 342.

The first selection line control unit 341 may correspond to the first memory block 331 and output first selection line control signals CS_DSL_A and CS_SSL_A to float the selection lines DSL_A and SSL_A of the first memory block 331.

The second selection line control unit 342 may correspond to the second memory block 332 and output second selection line control signals CS_DSL_B and CS_SSL_B to float the selection lines DSL_B and SSL_B of the second memory block 332.

The first and second selection line control units 341, 342 may selectively float only source selection lines, among selection lines of the first and second memory blocks 331, 342 corresponding thereto, respectively.

The selection line control circuit 340 may be controlled by the control logic 350. The control logic 350 may control the power supply unit 310 and the selection line control circuit 340 in response to the command signal CMD which may be an external input.

The block decoder 360 may generate and output the block selection signal BLKWL having a high voltage level when a memory block corresponding to the block address ADDR is the first memory block 331 or the second memory block 332.

Figure 6:
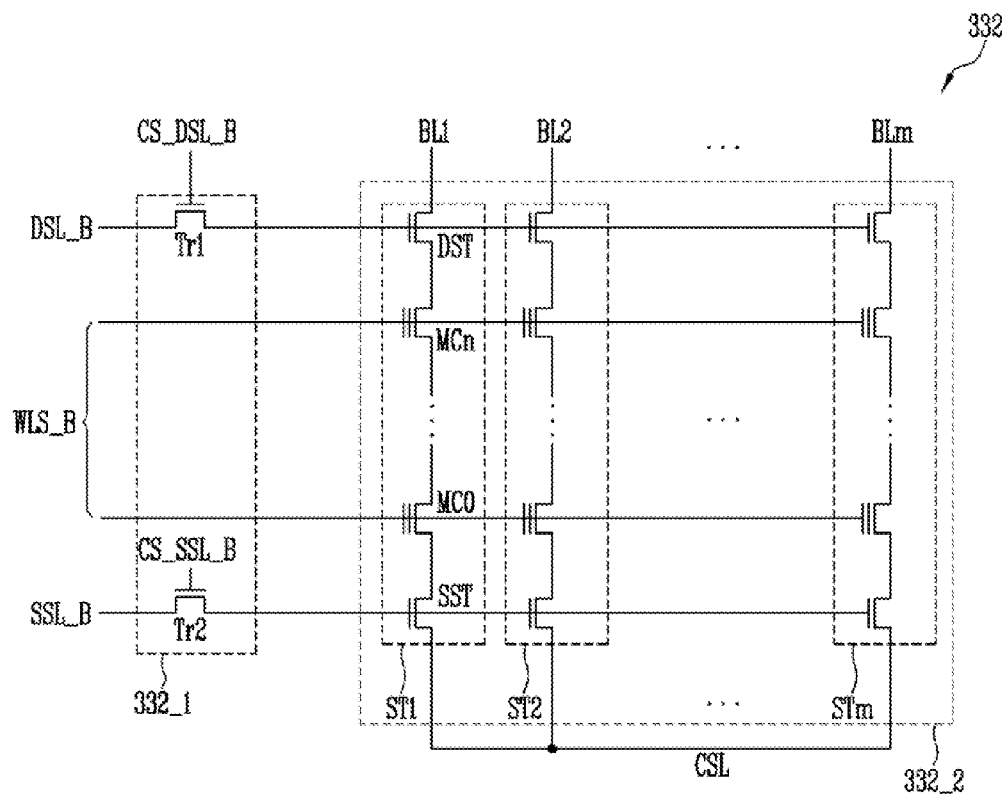
FIG. 6 is a circuit diagram of a memory block of a semiconductor memory device, according to an embodiment of the invention.

FIG. 6 is a circuit diagram of a memory block according to an embodiment of the invention. For example, FIG. 6 illustrates a detailed circuit diagram of a second memory block illustrated in FIG. 5.

Since the first memory block 331 and the second memory block 332 shown in FIG. 5 have the same configuration, only the second memory block 332 is described for convenience of explanation.

The second memory block 332 may include a voltage control unit 332_1 and a memory cell unit 332_2.

The voltage control unit 332_1 may include a first transistor Tr1 and a second transistor Tr2.

The first transistor Tr1 may be coupled between the drain selection line DSL_B and a gate of a drain selection transistor DST of the memory cell unit 332_2. The first transistor Tr1 may apply the operating voltage, transferred through the drain selection line DSL_B, to the gate of the drain selection transistor DST, or float the gate of the drain selection transistor DST in response to the second selection line control signal CS_DSL_B.

The second transistor Tr2 may be coupled between the source selection line SSL_B and a gate of a source selection transistor SST of the memory cell unit 332_2. The second transistor Tr2 may apply an operating voltage, transferred through the source selection line SSL_B, to the gate of the source selection transistor SST, or float the gate of the source selection transistor SST in response to the second selection line control signal CS_SSL_B.

For example, when the second memory block 332 is an unselected memory block during a program operation, the first and the second transistors Tr1 and Tr2 may be turned on in response to the second selection line control signals CS_DSL_B and CS_SSL_B, the gates of the drain selection transistor DST and the source selection transistor SST may be in a floating state.

In another example, when the second memory block 332 is an unselected memory block during a program operation, the first transistor Tr1 may be turned on in response to the second selection line control signal CS_DSL_B, and an operating voltage of 0V, transferred through the drain selection line DSL_B, may be applied to the gate of the drain selection transistor DST to turn off the drain selection transistor DST. In addition, the second transistor Tr2 may be turned off in response to the second selection line control signal CS_SSL_B, and the gate of the source selection transistor DST may be in a floating state.

The memory cell unit 332_2 may include a plurality of strings ST1 to STm coupled between a common source line CSL and a plurality of bit lines BL1 to BLm, respectively.

Each of the plurality of strings ST1 to STm may have the same configuration. The first string ST1 may include a source selection transistor SST, a plurality of memory cells MC0 to MCn and a drain selection transistor DST coupled in series between the common source line CSL and the bit line BL1. Gates of the memory cells MC0 to MCn may be coupled to the word lines WLs_B, respectively.

Figure 7:
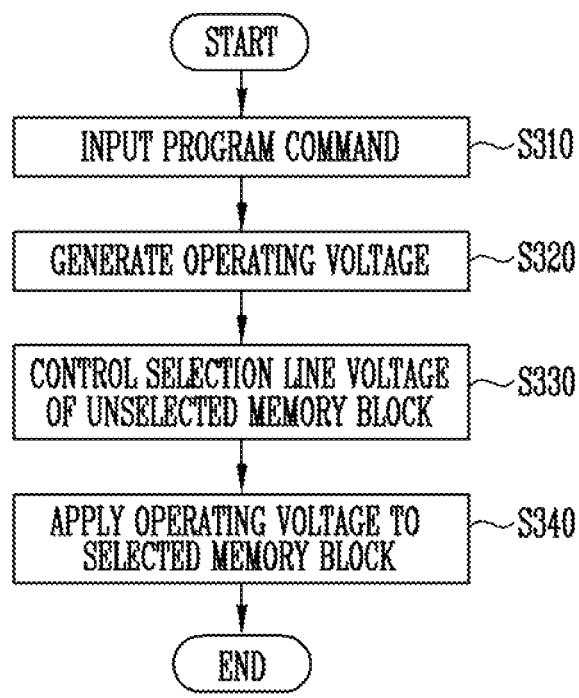
FIG. 7 is a flowchart illustrating an operation of a semiconductor memory device, according to yet another embodiment of the invention.

FIG. 7 is a flowchart illustrating an operation of a semiconductor memory device, according to yet another embodiment of the invention. For example, the operation of FIG. 7 may be an operation of the semiconductor memory device 300 shown in FIG. 5.

Operations of a semiconductor memory device according to another embodiment are described below with reference to FIGS. 5, 6 and 7.

According to an embodiment, an example in which a program operation is performed by selecting the first memory block 331 from among the first and second memory block 331 and 332 is described below.

At step S310 when a program command signal CMD associated with a program operation is input from an external device, the control logic 350 may generate a control signal to control the power supply unit 310 and the selection line control circuit 340.

At step S320 the voltage generation 311 of the power supply unit 310 may generate an operating voltage. For example, the voltage generation unit 311 may generate a plurality of operating voltages for a program operation in response to control of the control logic 350. For example, the voltage generation unit 311 may generate a program voltage, a pass voltage and a selection transistor control voltage.

The global line switch unit 312 may activate and apply the plurality of operating voltages generated by the voltage generation unit 311 to the first global lines GDSL_A, GWLs_A, and GSSL_A. In addition, the global line switch unit 112 may apply a voltage of 0V to the second global lines GDSL_B, GWLs_B, and GSSL_B.

At step S330, the selection line voltage of the unselected memory block may be controlled. For example, the second selection line control unit 342 of the selection line control circuit 340 corresponding to the unselected second memory block 332 may generate the second selection line control signals CS_DSL_B and CS_SSL_B in response to control of the control logic 350. For example, each of the second selection line control signals CS_DSL_B and CS_SSL_B may have a low logic level. In addition, according to another embodiment, the second selection line control signal CS_DSL_B may be applied at a high logic level, and the second selection line control signal CS_SSL_B may be applied at a low logic level. Therefore, the gate of the source selection transistor SST of the second memory block 332 may be in a floating state, and the gate of the drain selection transistor DST may be in a floating state, or the drain selection transistor DST may be turned on.

In addition, the first selection line control unit 341 corresponding to the selected first memory block 331 may generate the first selection line control signals CS_DSL_A and CS_SSL_A in response to control of the control logic 350. For example, the first selection line control signals CS_DSL_A and CS_SSL_A may have a high logic level.

At step S340, an operating voltage may be applied to the selected memory block. For example, during a program operation, a positive voltage may be applied to the common source line shared by the first and the second memory blocks 331 and 332, and the positive voltage or 0V may be applied to the bit lines shared by the first and the second memory blocks 331 and 332, according to program data.

When the first memory block 331 is a selected memory block, and the second memory block 332 is an unselected memory block, the block decoder 360 may generate and output the block selection signal BLKWL having a high voltage level in response to the block address ADDR.

In response to the block selection signal BLKWL, the first pass unit 321 may electrically connect the first global lines GDSL_A, GWLs_A, and GSSL_A to the plurality of word lines WLs_A and selection lines DSL_A and SSL_A of the first memory block 331. Also, in response to the block selection signal BLKWL, the second pass unit 322 may electrically connect the second global lines GDSL_B, GWLs_B, and GSSL_B to the plurality of word lines WLs_B and selection lines DSL_B and SSL_B of the second memory block 332.

The program voltage and the pass voltage may be applied to the plurality of word lines WLs_A of the selected first memory block 331, and the selection transistor control voltage may be applied to the selection lines DSL_A and SSL_A. An operating voltage of 0V may be applied to the plurality of word lines WLs_B and selection lines DSL_B and SSL_B of the unselected second memory block 332.

Since the gate of the source selection transistor SST of the unselected second memory block 332 is in a floating state, a potential level thereof may be increased by capacitive coupling with neighboring wires and terminals. When the potential level of the gate of the source selection transistor SST is increased to 0V or greater, generation of hot holes may be prevented in a lower channel of the source selection transistor by a gate induced drain leakage (GIDL) phenomenon. Therefore, hot holes may be prevented from being introduced and trapped in a channel of the unselected memory block.

In addition, when the drain selection transistor DST of the second memory block 332 is turned off, leakage current through a string may be blocked.

Table 4 below shows potential states of word lines and selection lines of a selected memory block and an unselected memory block according to the above-described embodiments.

TABLE 4

| | Selected memory block | | | Unselected memory block | | |
|---|---|---|---|---|---|---|
| | Global lines | Block selection signal | Word lines and selection line | Global lines | Block selection signal | Word lines and selection transistor gate |
| GSSL/ SSL | 0V | High voltage | 0V | 0V | High voltage | Floating |
| GDSL/ DSL | Drain selection transistor Turn-on voltage | | Drain selection transistor Turn-on voltage | 0V | | Floating or 0V |
| GWLs/ WLs | Program voltage or pass voltage | | Program voltage or pass voltage | 0V | | 0V |

As shown in Table 4, a gate of the source selection transistor of the unselected memory block, among the plurality of memory blocks corresponding to the pass units sharing a single block selection signal, may be in a floating state. Therefore, during a program operation of the selected memory block, generation of hot holes in a lower channel of a source selection transistor of the unselected memory block may be prevented.

In addition, when a voltage of 0V is applied to the gate of the unselected drain selection transistor, the drain selection transistor may be turned off to block leakage current through a string.

Figure 8:
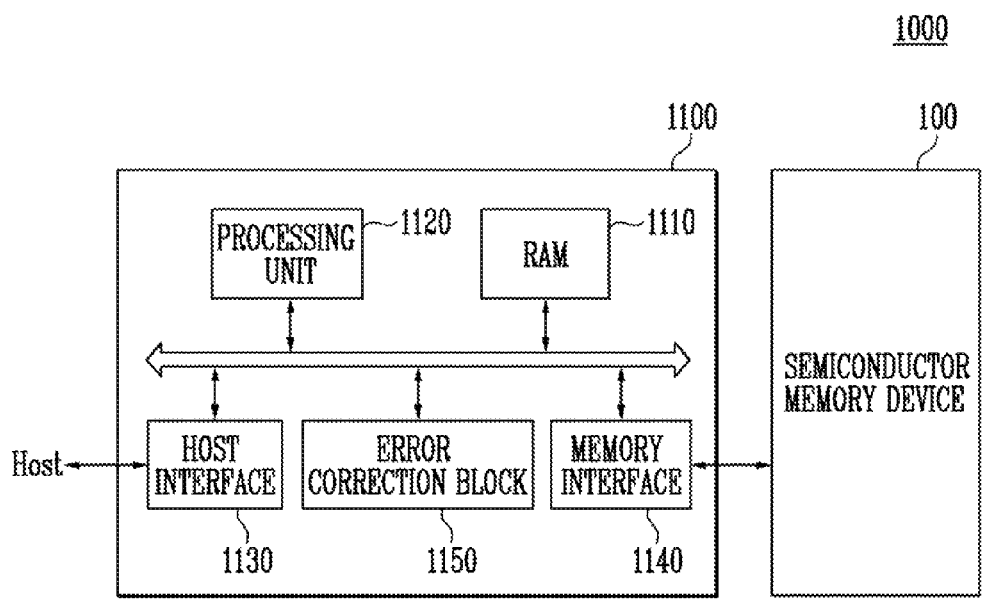
FIG. 8 is a block diagram illustrating a memory system including a semiconductor memory device, according to an embodiment of the invention.

Referring to FIG. 8 a memory system 1000, according to an embodiment of the invention. For example, the memory system 1000 may include a semiconductor memory device as the ones shown in FIG. 1, 3, or 5.

In the embodiment shown in FIG. 8, the memory system 1000 may include the semiconductor memory device 100 and a controller 1100.

However, it is noted that the semiconductor memory device 100 may be the same as the semiconductor memory device described above with reference to FIG. 1, the semiconductor memory device described above with reference to FIG. 3, or the semiconductor memory device described above with reference to FIG. 5. Thus, a detailed description thereof will be omitted.

The controller 1100 may be coupled to a host (not shown) and the semiconductor memory device 100. The controller 1100 may be configured to access the semiconductor memory device 100 at the request of the host. For example, the controller 1100 may control a read operation, a program operation, an erase operation, and/or a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as operation memory of the processing unit 1120, a cache memory between the semiconductor memory device 100 and the host, and/or a buffer memory between the semiconductor memory device 100 and the host. The processing unit 1120 may control operations of the controller 1100. In addition, the controller 1100 may temporarily store program data provided form the host during a write operation.

The host interface 1130 may include a protocol for exchanging data between the host and the controller 1100. For example, the controller 1100 may communicate with the host through one or more various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an Integrated drive electronics (IDE) protocol, a private protocol, and or the like.

The memory interface 1140 may interface with the semiconductor memory device 100. For example, the memory interface may include a NAND flash interface or a NOR flash interface.

The error correction block 1150 may detect and correct errors in data read from the semiconductor memory device 100 by using an error correction code (ECC). The processing unit 1120 may control a read voltage based on an error detection result of the error correction block 1150 and perform a re-read operation. According to an embodiment, the error correction block may be provided as a component of the controller 1100.

The controller 1100 and the semiconductor memory device 100 may be integrated in a single semiconductor device. According to an embodiment, the controller 1100 and the semiconductor memory device 100 may be integrated in a single semiconductor device to form a memory card such as a personal computer memory card international association (PCMCIA) card, a compact flash card (CF), a smart media card (SMC), a memory stick, a multimedia card (e.g., MMC, RS-MMC or MMCmicro), an SD card (e.g., SD, miniSD, micro SD or SDHC), a universal flash storage device (UFS), and or the like.

The controller 1100 and the semiconductor memory device 100 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra-mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, and or the like.

According to an exemplary embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi-chip package (MCP), a wafer-level fabricated package (WFP), a wafer-level processed stack package (WSP), and or the like.

Figure 9:
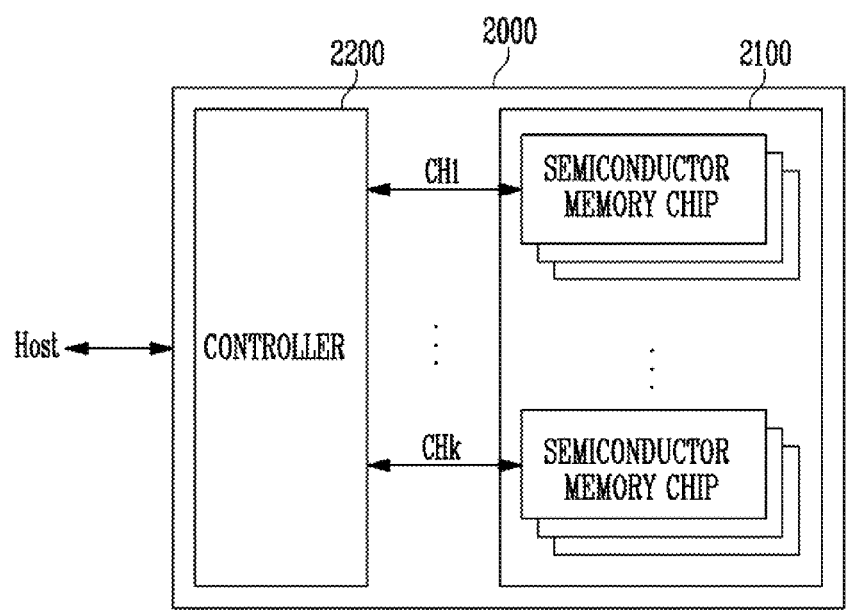
FIG. 9 is a block diagram illustrating an application example of a memory system, according to an embodiment of the invention.

FIG. 9 is a block diagram illustrating an application example of a memory system 2000, according to an embodiment of the invention. For example, the memory system 2000 may correspond to the memory system 1000 shown in FIG. 8.

Referring to FIG. 9, the memory system 2000 may include a semiconductor memory device 2100 and a controller 2200. The semiconductor memory device 2100 may include a plurality of semiconductor memory chips. The plurality of semiconductor memory chips may be divided into groups.

Each of the groups including the plurality of semiconductor memory chips may be communicating with the controller 2200 through first to k-th channels CH1 to CHk. Each of the semiconductor memory chips may be configured and operated in substantially the same manner as one of the semiconductor memory devices 100, 200 and 300 described above with reference to FIGS. 1, 3, and 5, respectively.

Each group may communicate with the controller 2200 through a single common channel. The controller 2200 may be configured in substantially the same manner as the controller 1100 described with reference to FIG. 8, and configured to control the plurality of memory chips of the semiconductor memory device 2100 through the plurality of first to k-th channels CH1 to CHk.

Figure 10:
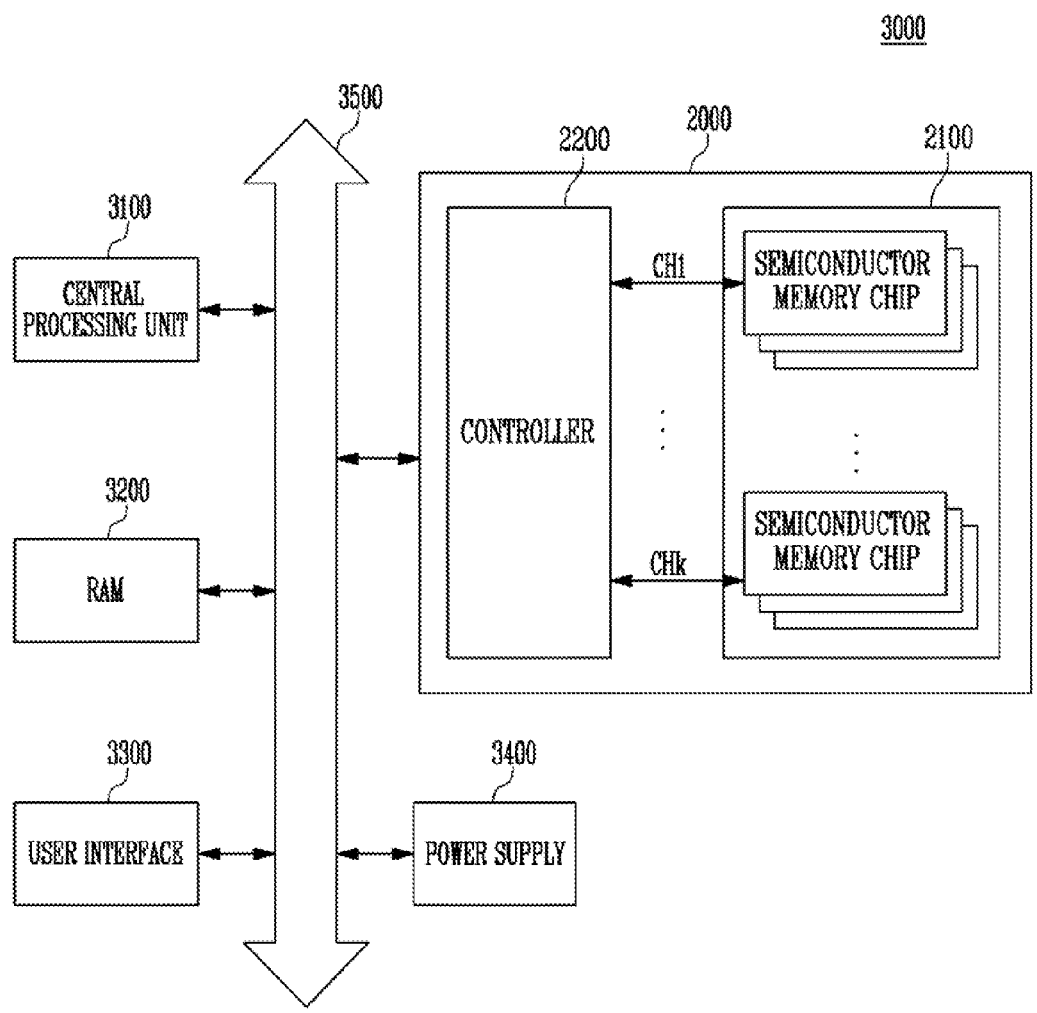
FIG. 10 is a block diagram illustrating a computing system including a semiconductor device, according to an embodiment of the invention.

FIG. 10 is a block diagram illustrating a computing system 3000, according to an embodiment of the invention. For example, the computing system 3000 may have the memory system described above with reference to FIG. 9.

Referring to FIG. 10, the computing system 3000 may include a central processing unit 3100, a random access memory (RAM) 3200, a user interface 3300 and a power supply 3400.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

As Illustrated in FIG. 10, the semiconductor memory device 2100 may be coupled to the system bus 3500 through the controller 2200. However, the semiconductor memory device 2100 may be directly coupled to the system bus 3500. The central processing unit 3100 and the RAM 3200 may perform the functions of the controller 2200.

As illustrated in FIG. 10, the memory system 2000 shown in FIG. 9 may be included as the memory system 3000. However, the memory system 2000 may be replaced with the memory system 1000 described above with reference to FIG. 8. According to an embodiment, the computing system 3000 may include both of the memory systems 1000 and 2000 described above with reference to FIGS. 8 and 9, respectively.

According to embodiments, during a program operation of a semiconductor memory device, voltages of word lines and selection lines of an unselected memory block may be controlled so that electrons may be trapped in a channel of the unselected memory block. As a result, a threshold voltage distribution of the unselected memory block may be improved.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor memory device, comprising:
   a memory unit including a first memory block and a second memory block;
   a voltage generation unit suitable for applying a plurality of operating voltages to at least one of first or second global lines;
   a switching circuit suitable for switching the first global lines and corresponding first internal global lines and the second global lines and corresponding second internal global lines;
   a pass circuit suitable for electrically connecting the first internal global lines to word lines and selection lines of the first memory block and electrically connecting the second internal global lines to word lines and selection lines of the second memory block in response to a block selection signal,
   wherein the switching circuit controls the first internal global lines or the second internal global lines corresponding to an unselected memory block between the first and second memory blocks to be in a floating state.

2. The semiconductor memory device of claim 1, further comprising:
   a control logic suitable for generating the first control signal and the second control signal according to a program command; and
   a block decoder suitable for generating the block selection signal in response to a block address.

3. The semiconductor memory device of claim 2, wherein the pass circuit comprises:
   a first pass unit suitable for electrically connecting the first internal global lines to the word lines and the selection lines of the first memory block in response to the block selection signal; and
   a second pass unit suitable for electrically connecting the second internal global lines to the word lines and the selection lines of the second memory block in response to the block selection signal,
   wherein the first and second pass units share the block decoder.

4. The semiconductor memory device of claim 1, wherein the switch circuit comprises:
   a first switch unit coupled between the first global lines and the first internal global lines, suitable for applying the plurality of operating voltages, transferred through the first global lines, to the first internal global lines, or floating the first internal global lines in response to the first control signal; and
   a second switch unit coupled between the second global lines and the second internal global lines, suitable for applying the plurality of operating voltages, transferred through the second global lines, to the second internal global lines, or floating the second internal global lines in response to the second control signal.

5. The semiconductor memory device of claim 1, wherein the first memory block and the second memory block share a plurality of bit lines and a common source line.

6. The semiconductor memory device of claim 1, wherein the power supply unit generates the plurality of operating voltages, applies the plurality of operating voltages to one of the first global lines or the second global lines corresponding to a selected memory block among the first memory block and the second memory block, and applies a voltage of 0V to one of the first global lines or the second global lines corresponding to the unselected memory block.

7. The semiconductor memory device of claim 1, further comprising:
   a selection line control circuit suitable for controlling potential levels of selection lines of the unselected memory block among the first memory block and the second memory block.

8. The semiconductor memory device of claim 7, wherein the selection line control circuit applies a voltage of 0V to turn off drain selection transistors and source selection transistors of the unselected memory block.

9. A semiconductor memory device, comprising:
   a memory unit including a first memory block and a second memory block;
   a power supply unit suitable for applying a plurality of operating voltages to one of first global lines or second global lines;
   a switching circuit suitable for switching the first global lines and first internal global lines in response to a first control signal, and switching the second global lines and second internal global lines in response to a second control signal; and
   a pass circuit suitable for electrically connecting the first internal global lines to word lines and selection lines of the first memory block, and electrically connecting the second internal global lines to word lines and selection lines of the second memory block in response to a block selection signal,
   wherein the power supply unit is suitable for applying the plurality of operating voltages to one of the first global lines or the second global lines corresponding to a selected memory block among the first memory block and the second memory block, and applying a predetermined voltage lower than the operating voltages to one of the first global lines or the second global lines corresponding to an unselected memory block among the first memory block and the second memory block.

10. The semiconductor memory device of claim 9, wherein the power supply unit applies a voltage of 0V to one of the first global lines or the second global lines corresponding to selection lines of the unselected memory block, and the predetermined voltage to one of the first global lines or the second global lines corresponding to word lines of the unselected memory block.

11. The semiconductor memory device of claim 9, further comprising:
   a control logic suitable for generating the first control signal and the second control signal in response to a program command; and
   a block decoder suitable for generating the block selection signal according to a block address.

12. The semiconductor memory device of claim 11, wherein the first control signal has a greater potential level than the plurality of operating voltages when the first memory block is the selected memory block in a program operation, and has a greater potential level than the predetermined voltage when the first memory block is the unselected memory block during the program operation, and
   wherein the second control signal has a greater potential level than the plurality of operating voltages when the second memory block is the selected memory block during the program operation, and a greater potential level than the predetermined voltage when the second memory block is the unselected memory block during the program operation.

13. The semiconductor memory device of claim 9, wherein the switch circuit comprises:
   a first switch unit coupled between the first global lines and the first internal global lines, suitable for applying one of the plurality of operating voltages, transferred through the first global lines, or the predetermined voltage to the first internal global lines in response to the first control signal; and
   a second switch unit coupled between the second global lines and the second internal global lines, suitable for applying one of the plurality of operating voltages, transferred through the second global lines, or the predetermined voltage to the second internal global lines in response to the second control signal.

14. The semiconductor memory device of claim 9, wherein during a program operation, the predetermined voltage is applied to word lines of the unselected memory block, and a voltage of 0V is applied to selection lines of the unselected memory block.

15. The semiconductor memory device of claim 9, wherein the first memory block and the second memory block share a plurality of bit lines and a common source line.

16. A semiconductor memory device, comprising:
   a memory unit including a first memory block and a second memory block;
   a power supply unit suitable for applying a plurality of operating voltages to one of first global lines or second global lines;
   a pass circuit suitable for electrically connecting the first global lines to word lines and selection lines of the first memory block and electrically connecting the second global lines to word lines and selection lines of the second memory block in response to a block selection signal; and
   a selection line control circuit suitable for controlling potential levels of selection lines of an unselected memory block among the first and second memory blocks.

17. The semiconductor memory device of claim 16, wherein the selection line control circuit comprises:
   a first selection line control unit corresponding to the first memory block, suitable for outputting first selection line control signals when the first memory block is the unselected memory block; and
   a second selection line control unit corresponding to the second memory block, suitable for outputting second selection line control signals when the second memory block is the unselected memory block.

18. The semiconductor memory device of claim 17, wherein each of the first memory block and the second memory block comprises:
   a voltage control unit suitable for floating gates of drain selection transistors and source selection transistors included in one of the first memory block or the second memory block in response to one of the first selection line control signals or the second selection line control signals; and
   a memory cell unit including a plurality of memory cells, drain selection transistors and source selection transistors.

19. The semiconductor memory device of claim 16, wherein the first memory block and the second memory block share a plurality of bit lines and a common source line.

20. The semiconductor memory device of claim 16, wherein the power supply unit generates the plurality of operating voltages, applies the plurality of operating voltages to one of the first global lines or the second global lines corresponding to a selected memory block among the first memory block and the second memory block, and applies a voltage of 0V to one of the first global lines or the second global lines corresponding to the unselected memory block.

* * * * *